(12) United States Patent
Zhao et al.

(10) Patent No.: US 8,666,338 B2
(45) Date of Patent: Mar. 4, 2014

(54) MULTI-MODE BYPASS DRIVER AMPLIFIER WITH TUNABLE LOAD MATCHING

(75) Inventors: Yu Zhao, San Diego, CA (US); Nathan M. Pletcher, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 3 days.

(21) Appl. No.: 13/356,492

(22) Filed: Jan. 23, 2012

(65) Prior Publication Data

US 2013/0190036 A1     Jul. 25, 2013

(51) Int. Cl.
*H01Q 11/12*     (2006.01)

(52) U.S. Cl.
USPC .............. 455/127.1; 455/91; 330/124 R

(58) Field of Classification Search
USPC ............. 455/550.1; 330/124 R, 126, 144
See application file for complete search history.

(56) References Cited

U.S. PATENT DOCUMENTS

| | | | |
|---|---|---|---|
| 6,397,090 B1 | 5/2002 | Cho | |
| 6,681,101 B1 | 1/2004 | Eidson et al. | |
| 6,806,768 B2 | 10/2004 | Klaren et al. | |
| 7,170,349 B2 | 1/2007 | Bhattacharjee et al. | |
| 7,385,445 B2 | 6/2008 | Wright | |
| 7,630,693 B2 | 12/2009 | Liu et al. | |
| 8,072,272 B2 | 12/2011 | Zhao et al. | |
| 8,181,140 B2 | 5/2012 | Kireev et al. | |
| 2003/0222709 A1 | 12/2003 | Kim | |
| 2010/0026393 A1 | 2/2010 | Keerti et al. | |
| 2010/0225400 A1 | 9/2010 | Rofougaran et al. | |
| 2010/0291888 A1 | 11/2010 | Hadjichristos et al. | |
| 2010/0295629 A1 | 11/2010 | Klemens et al. | |
| 2010/0321110 A1 | 12/2010 | Ichitsubo et al. | |
| 2011/0037516 A1* | 2/2011 | Nejati et al. .............. 330/124 R |
| 2011/0037519 A1 | 2/2011 | Pletcher et al. | |
| 2011/0049672 A1 | 3/2011 | Okushima et al. | |
| 2011/0115565 A1 | 5/2011 | Cabanillas | |
| 2011/0201391 A1 | 8/2011 | Mankaruse et al. | |

FOREIGN PATENT DOCUMENTS

WO     01022604     3/2001

OTHER PUBLICATIONS

International Search Report and Written Opinion—PCT/US2013/022806—ISA/EPO—Mar. 25, 2013.

* cited by examiner

*Primary Examiner* — Creighton Smith

(74) *Attorney, Agent, or Firm* — Ramin Mobarhan

(57) ABSTRACT

A multi-mode driver amplifier with tunable load matching is disclosed. In an exemplary design, an apparatus includes a multi-mode driver amplifier and a tunable impedance matching circuit. The driver amplifier amplifies an input radio frequency (RF) signal and provides an amplified RF signal. The tunable impedance matching circuit matches an output impedance of the driver amplifier. The apparatus may include a main transmit path and a bypass transmit path. The bypass transmit path may include the driver amplifier and the tunable impedance matching circuit and no power amplifier. The main transmit path may include a second driver amplifier and a power amplifier. The main transmit path may be selected for transmit power levels higher than a threshold level, and the bypass transmit path may be selected for transmit power levels lower than the threshold level.

20 Claims, 10 Drawing Sheets

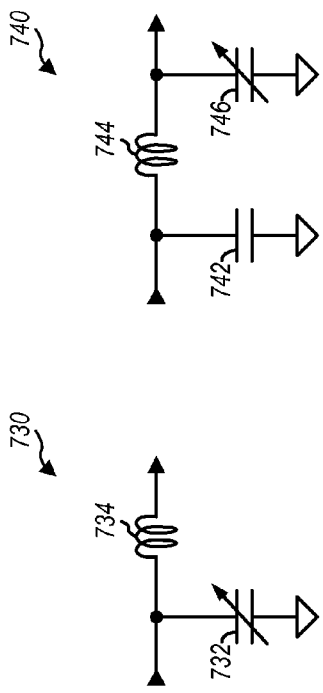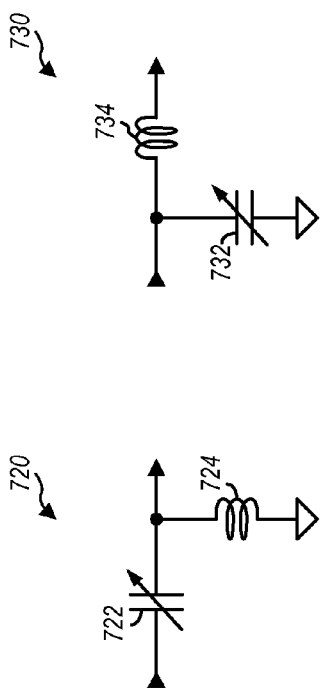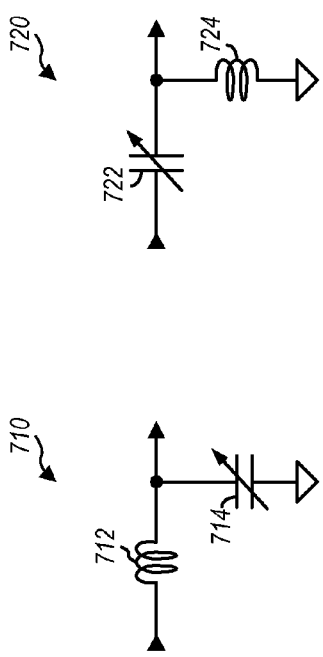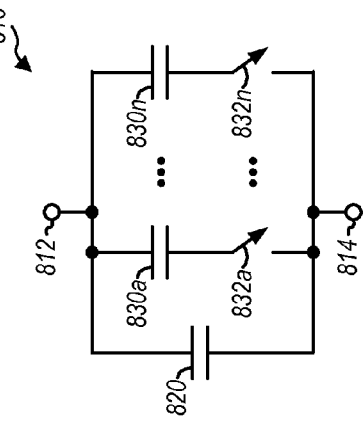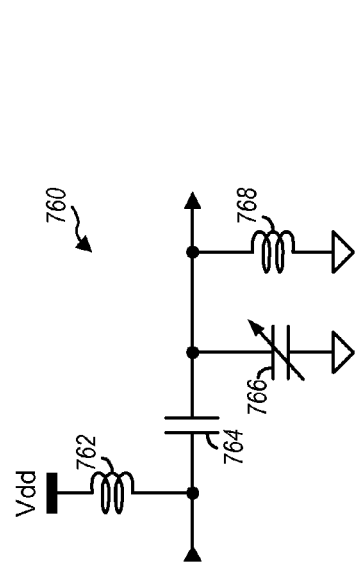

MULTI-MODE BYPASS DRIVER AMPLIFIER WITH TUNABLE LOAD MATCHING

BACKGROUND

I. Field

The present disclosure relates generally to electronics, and more specifically to a driver amplifier having improved performance.

II. Background

A wireless device (e.g., a cellular phone or a smart phone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated signal, amplify the modulated signal to obtain an output RF signal having the proper output power level, and transmit the output RF signal via an antenna to a base station. For data reception, the receiver may obtain a received RF signal via the antenna and may condition and process the received RF signal to recover data sent by the base station.

The transmitter may support multiple operating modes (or simply, modes). Each mode may correspond to a different transmit power level, a different radio technology, a different frequency band, etc. The transmitter may include a number of transmit paths to support the multiple modes. Each transmit path may support a specific mode and may include various circuits such as a driver amplifier, a power amplifier, impedance matching circuits, etc. A relatively large number of amplifiers and circuits may then be required for the transmitter, which may increase the size and cost of the transmitter.

BRIEF DESCRIPTION OF THE DRAWINGS

FIGS. 7A-7F show exemplary designs of a tunable impedance matching circuit.

FIG. 8 shows a schematic diagram of a tunable capacitor.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

A multi-mode driver amplifier with tunable output impedance matching and capable of supporting multiple modes is described herein. This driver amplifier may be used for wireless devices and other electronics devices.

Figure 1:
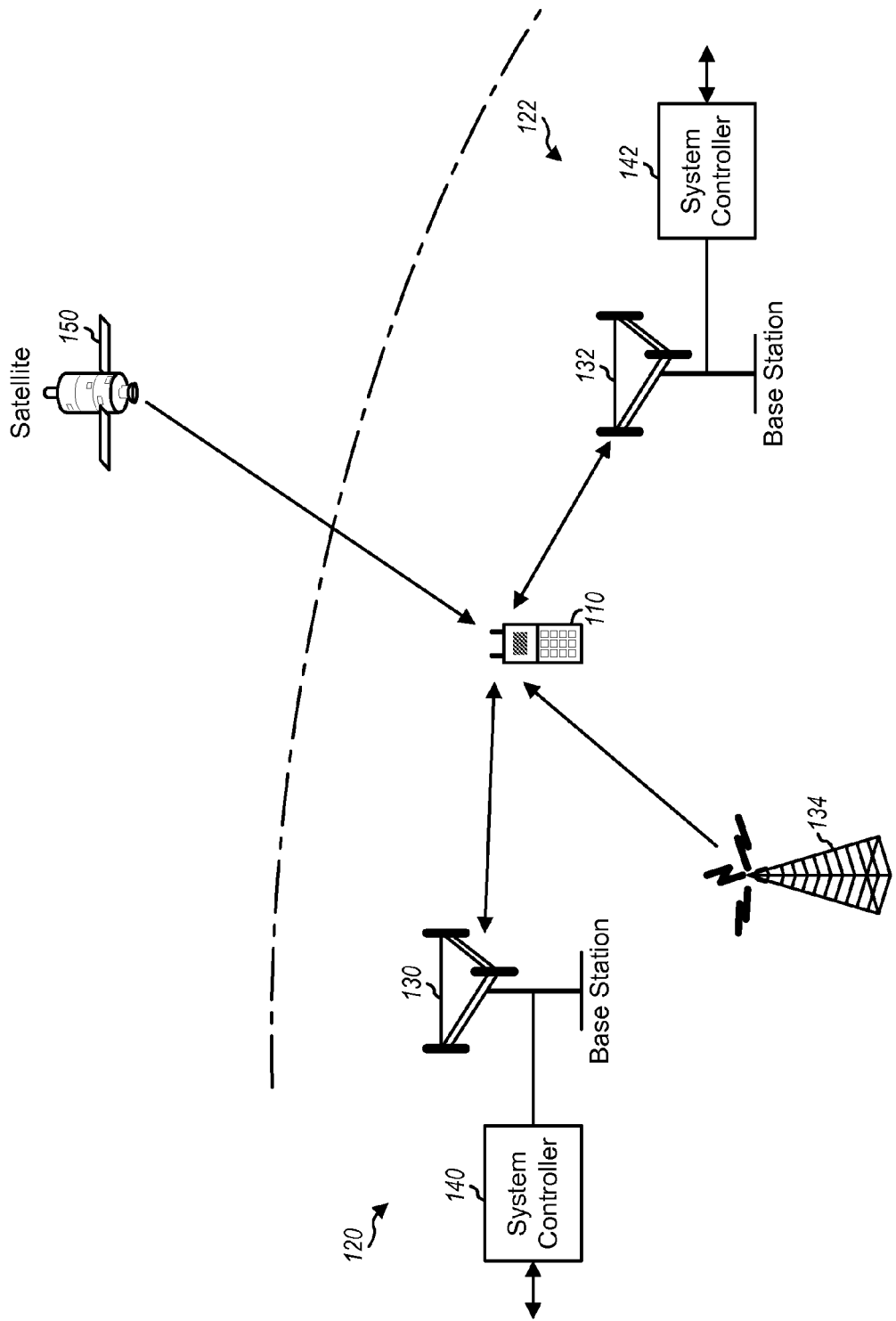
FIG. 1 shows a wireless device capable of communicating with different wireless communication systems.

FIG. 1 shows a wireless device 110 capable of communicating with different wireless communication systems 120 and 122. Wireless systems 120 and 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), cdma2000, or some other version of CDMA. For simplicity, FIG. 1 shows wireless system 120 including one base station 130 and one system controller 140, and wireless system 122 including one base station 132 and one system controller 142. In general, each wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smart phone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120 and/or 122. Wireless device 110 may also be capable of receiving signals from broadcast stations (e.g., a broadcast station 134). Wireless device 110 may also be capable of receiving signals from satellites (e.g., a satellite 150) in one or more global navigation satellite systems (GNSS). Wireless device 110 may support one or more radio technologies for wireless communication such as LTE, cdma2000, WCDMA, GSM, IEEE 802.11, etc.

Figure 2:
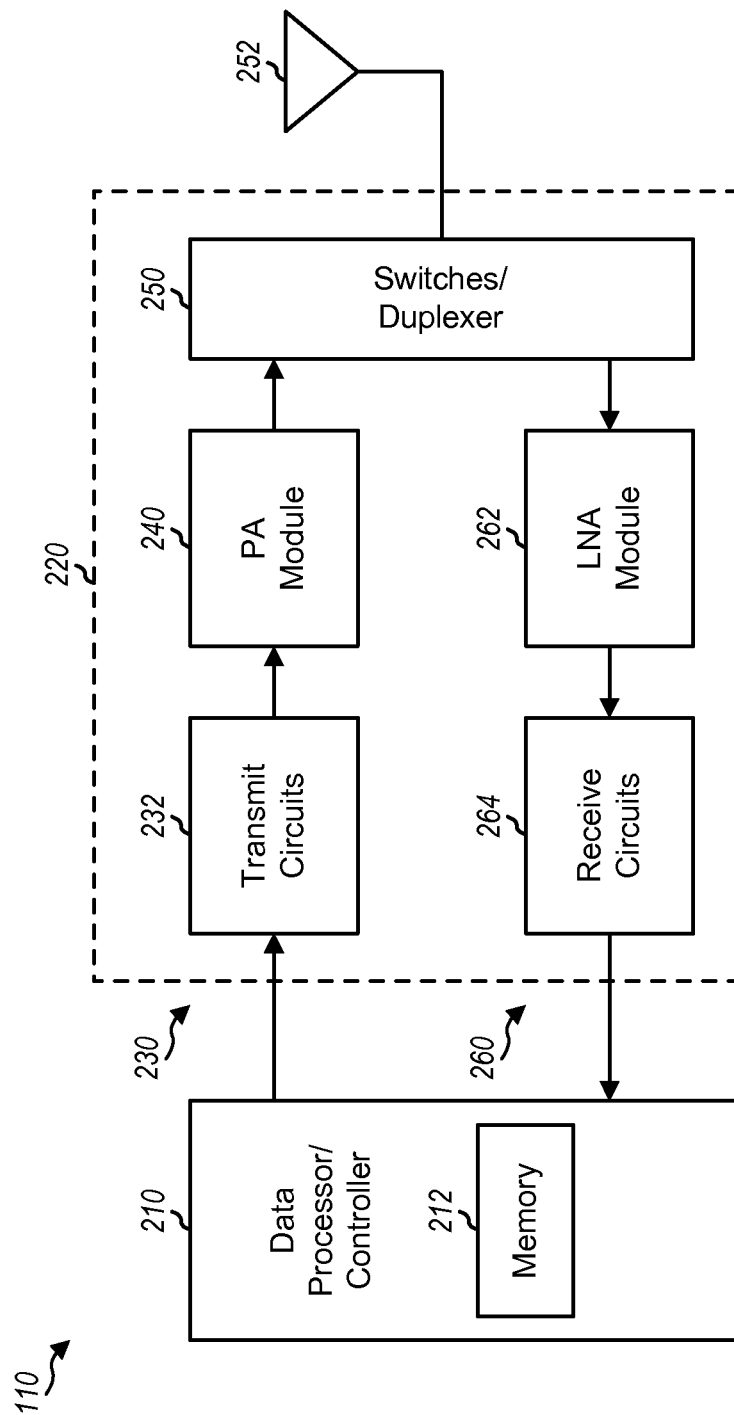
FIG. 2 shows a block diagram of a wireless device.

FIG. 2 shows a block diagram of an exemplary design of wireless device 110 in FIG. 1. In this exemplary design, wireless device 110 includes a data processor/controller 210, a transceiver 220, and an antenna 252. Transceiver 220 includes a transmitter 230 and a receiver 260 that support bi-directional wireless communication.

In the transmit path, data processor 210 processes (e.g., encodes and modulates) data to be transmitted and provides an analog output signal to transmitter 230. Within transmitter 230, transmit circuits 232 amplify, filter, and upconvert the analog output signal from baseband to RF and provide a modulated RF signal. Transmit circuits 232 may include amplifiers, filters, mixers, an oscillator, a local oscillator (LO) generator, a phase locked loop (PLL), etc. A power amplifier (PA) module 240 receives and amplifies the modulated RF signal and provides an output RF signal having the proper output power level. PA module 240 may include driver amplifiers, power amplifiers, impedance matching circuits, etc., as described below. The output RF signal is routed through switches/duplexer 250 and transmitted via antenna 252.

In the receive path, antenna 252 receives signals from base stations and/or other transmitter stations and provides a received RF signal, which is routed through switches/duplexer 250 and provided to receiver 260. Within receiver 260, a low noise amplifier (LNA) module 262 amplifies the received RF signal and provides an amplified RF signal.

Receive circuits 264 amplify, filter, and downconvert the amplified RF signal from RF to baseband and provide an analog input signal to data processor 210. Receive circuits 264 may include amplifiers, filters, mixers, an oscillator, an LO generator, a PLL, etc.

FIG. 2 shows an exemplary design of transceiver 220. Transmitter 230 and/or receiver 260 may include different and/or additional circuits not shown in FIG. 2. For example, transmitter 230 may include filters, impedance matching circuits, etc., which are not explicitly shown in FIG. 2 for simplicity. All or a portion of transceiver 220 may be implemented on one or more analog integrated circuits (ICs), RF ICs (RFICs), mixed-signal ICs, etc. For example, transmit circuits 232, PA module 240, LNA module 262, and receive circuits 264 may be implemented on an RFIC. PA module 240 and possibly other circuits may also be implemented on a separate IC or module.

Data processor/controller 210 may perform various functions for wireless device 110. For example, data processor 210 may perform processing for data being transmitted via transmitter 230 and received via receiver 260. Controller 210 may control the operation of transmit circuits 232, receive circuits 264, PA module 240, LNA module 262, switches/duplexer 250, etc. A memory 212 may store program codes and data for data processor/controller 210. Data processor/controller 210 may be implemented on one or more application specific integrated circuits (ASICs) and/or other ICs.

Wireless device 110 may support multiple modes, which may cover different transmit/output power levels, different radio technologies, different frequency bands, etc. PA module 240 may be designed to support all of the modes supported by wireless device 110.

It is desirable to obtain high power added efficiency (PAE) for PA module 240 over a wide range of transmit power levels, e.g., from −50 dBm to +29 dBm for CDMA. A power amplifier can provide high transmit power (e.g., +27 dBm to +33 dBm) required by a wireless system. However, the power amplifier typically consumes a large amount of power and current when it is turned on. Since high transmit power may be required for only a fraction of the time, a PA module may include multiple transmit paths for different ranges of transmit power levels. A power amplifier may be required for only the highest range of transmit power levels and may be included in a main transmit path. Only a driver amplifier may be sufficient for a lower range of transmit power levels. Hence, only a driver amplifier may be included in a bypass transmit path covering a lower range of transmit power levels.

A PA module may include a single bypass transmit path. A driver amplifier in this single bypass transmit path may be designed to provide the required performance (e.g., the required linearity) at the highest transmit power level supported by the bypass transmit path. This driver amplifier may then have low efficiency at lower transmit power levels. A PA module may include multiple bypass transmit paths to improve efficiency.

Figure 3:
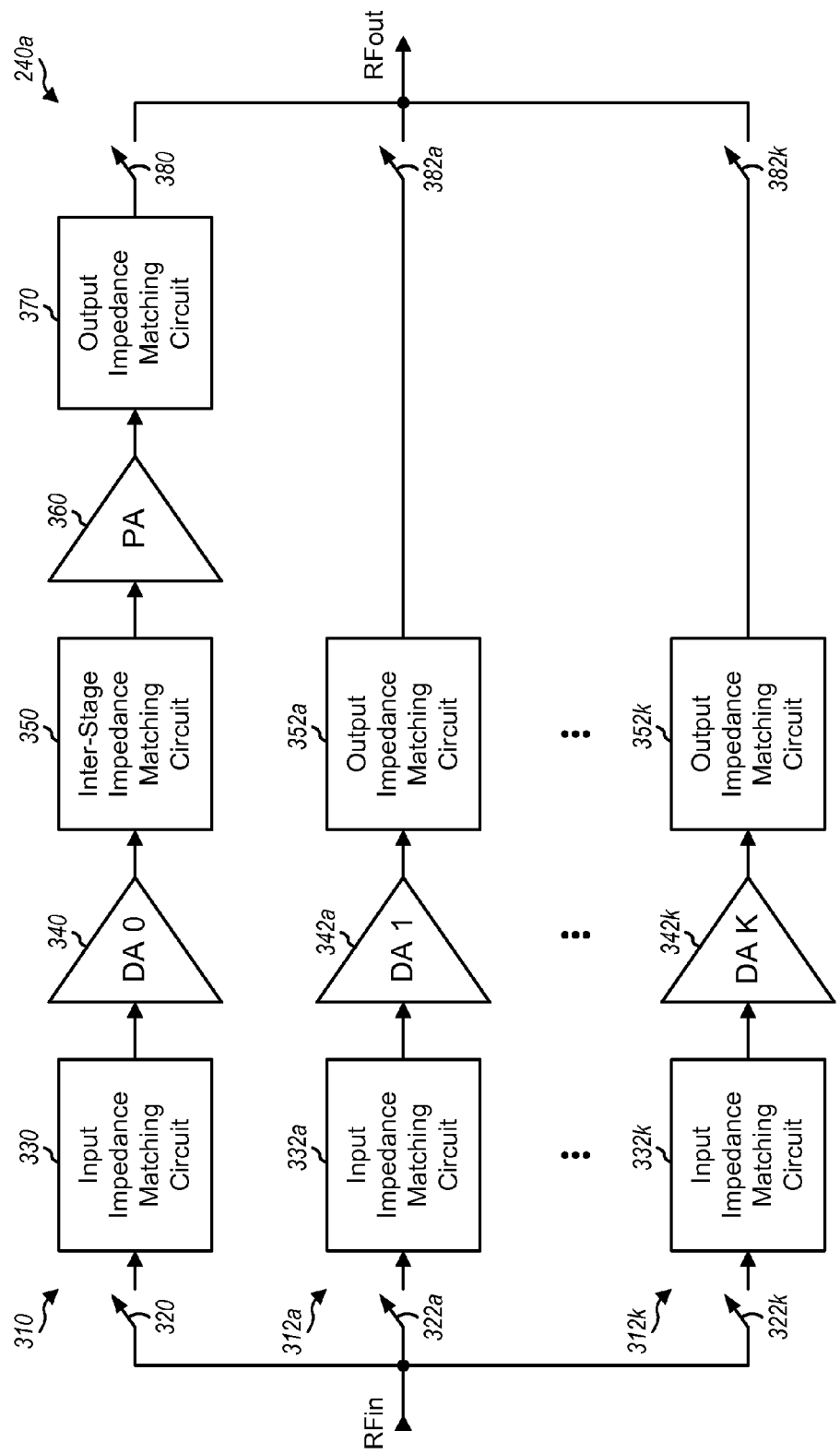
FIG. 3 shows a block diagram of a power amplifier (PA) module.

FIG. 3 shows a block diagram of a PA module 240a, which is one exemplary design of PA module 240 in FIG. 2. PA module 240a includes a main/full-power transmit path 310 and K bypass paths 312a to 312k, where K may be any integer value greater than one. Main transmit path 310 includes a driver amplifier 340 and a power amplifier 360. Each bypass path 312 includes only a driver amplifier 342 and no power amplifier. A driver amplifier in a bypass transmit path may be referred to as a bypass driver amplifier.

Within main transmit path 310, a switch 320 has one end coupled to an input (RFin) of PA module 240a and the other end coupled to the input of an input impedance matching circuit 330. Driver amplifier (DA) 340 has its input coupled to the output of matching circuit 330 and its output coupled to the input of an inter-stage impedance matching circuit 350. Power amplifier (PA) 360 has its input coupled to the output of matching circuit 350 and its output coupled to the input of an output impedance matching circuit 370. A switch 380 has one end coupled to the output of matching circuit 370 and the other end coupled to an output (RFout) of PA module 240a.

Within each bypass transmit path 312, a switch 322 has one end coupled to the input of PA module 240a and the other end coupled to the input of an input impedance matching circuit 332. Driver amplifier 342 has its input coupled to the output of matching circuit 332 and its output coupled to the input of an output impedance matching circuit 352. A switch 382 has one end coupled to the output of matching circuit 352 and the other end coupled to the output of PA module 240a.

In main transmit path 310, matching circuit 330 performs input impedance matching for driver amplifier 340. Driver amplifier 340 provides amplification for an input RF signal. Matching circuit 350 performs impedance matching between the output of driver amplifier 340 and the input of power amplifier 360. Power amplifier 360 provides amplification and high output power for an output RF signal. Matching circuit 370 performs output impedance matching for power amplifier 360. In each bypass transmit path 312, matching circuit 332 performs input impedance matching for driver amplifier 342. Driver amplifier 342 provides amplification for the input RF signal. Matching circuit 352 performs output impedance matching for driver amplifier 342.

One or more amplifiers may be included in each transmit path and may be designed to provide good efficiency for a range of transmit power levels supported by that transmit path. For example, the number of transistors in an amplifier, the size of each transistor, the biasing for each transistor, the load of the amplifier, and/or other characteristics of the amplifier may be dependent on, and hence may be selected based on, the range of transmit power levels supported by the amplifier.

Figure 4:
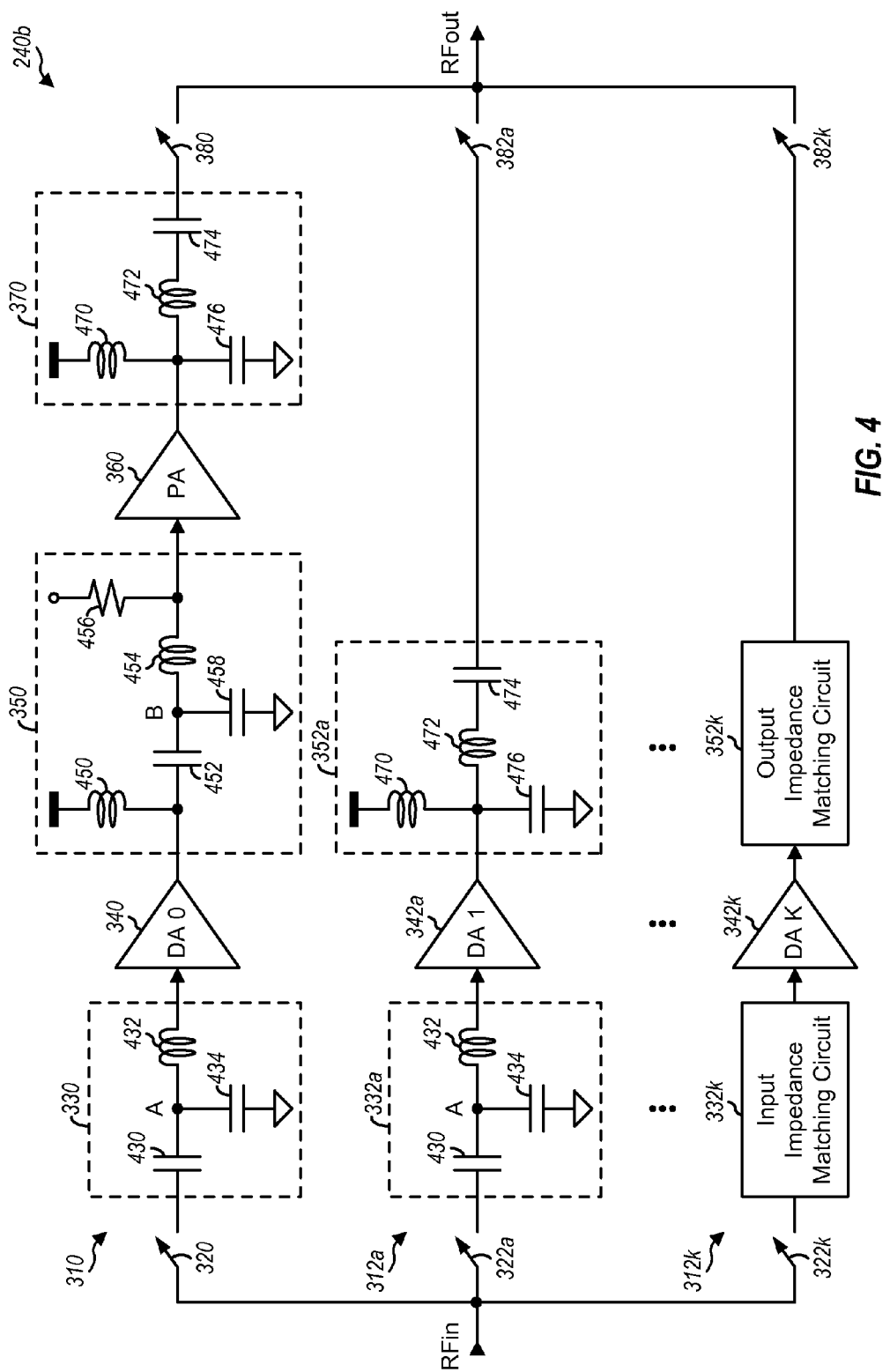
FIG. 4 shows a schematic diagram of impedance matching circuits in the PA module in FIG. 3.

FIG. 4 shows a schematic diagram of a PA module 240b, which is an exemplary design of PA module 240a in FIG. 3. FIG. 4 shows exemplary designs of the input, inter-stage, and output impedance matching circuits in FIG. 3.

Within input impedance matching circuit 330 in main transmit path 310, a capacitor 430 is coupled between the input of matching circuit 330 and node A. An inductor 432 is coupled between node A and the output of matching circuit 330. A capacitor 434 is coupled between node A and circuit ground.

Within inter-stage impedance matching circuit 350 in main transmit path 310, an inductor 450 is coupled between the input of matching circuit 350 and a power supply (Vdd). A capacitor 452 is coupled between the input of matching circuit 350 and node B. An inductor 454 is coupled between node B and the output of matching circuit 350. A resistor 456 is coupled between the output of matching circuit 350 and a bias voltage. A capacitor 458 is coupled between node B and circuit ground.

Within output impedance matching circuit 370 in main transmit path 310, an inductor 470 is coupled between the input of matching circuit 370 and the Vdd supply. An inductor 472 and a capacitor 474 are coupled in series, and the combination is coupled between the input and output of matching circuit 370. A capacitor 476 is coupled between the input of matching circuit 370 and circuit ground.

Input impedance matching circuit 332 in each bypass transmit path 312 may be implemented in similar manner as input impedance matching circuit 330 in main transmit path 310. Output impedance matching circuit 352 in each bypass transmit path 312 may be implemented in similar manner as output impedance matching circuit 370 in main transmit path 310.

FIG. 4 shows exemplary designs of input, inter-stage, and output impedance matching circuits. An impedance matching circuit may also be implemented with other circuit topologies, as described below.

Driver amplifiers 342a to 342k in bypass transmit paths 312a to 312k may have different input and/or output impedances due to their different circuit designs and/or different biasing. Different input and/or output impedance matching circuits may then be required for driver amplifiers 342a to 342k in order to achieve good efficiency over different ranges of transmit power levels.

A PA module may include multiple bypass transmit paths (e.g., as shown in FIGS. 3 and 4) in order to achieve high efficiency over a wide range of transmit power levels. However, a relatively large number of circuit components may be used to implement the impedance matching circuits for the driver amplifiers in different bypass transmit paths, e.g., as shown in FIG. 4. This would increase the complexity, size, and cost of the PA module with multiple bypass transmit paths.

In an aspect, a multi-mode driver amplifier with tunable output impedance matching (i.e., tunable load matching) may be used to efficiently support multiple modes. The multi-mode driver amplifier may have one or more characteristics that can be varied for different modes. For example, the biasing of the multi-mode driver amplifier, or the number of amplifier stages that can be coupled in series or parallel, and/or other features of the multi-mode driver amplifier may be varied for different ranges of transmit power levels. The output impedance matching of the multi-mode driver amplifier may also be varied for different modes (e.g., different ranges of transmit power levels), possibly in conjunction with adjustments of the multi-mode driver amplifier. The multi-mode driver amplifier with tunable output impedance matching may (i) provide good efficiency over a wide range of transmit power levels, (ii) enable the use of a single bypass transmit path in a PA module, and (iii) provide other advantages such as reduced complexity, size, and cost of the PA module.

Figure 5:
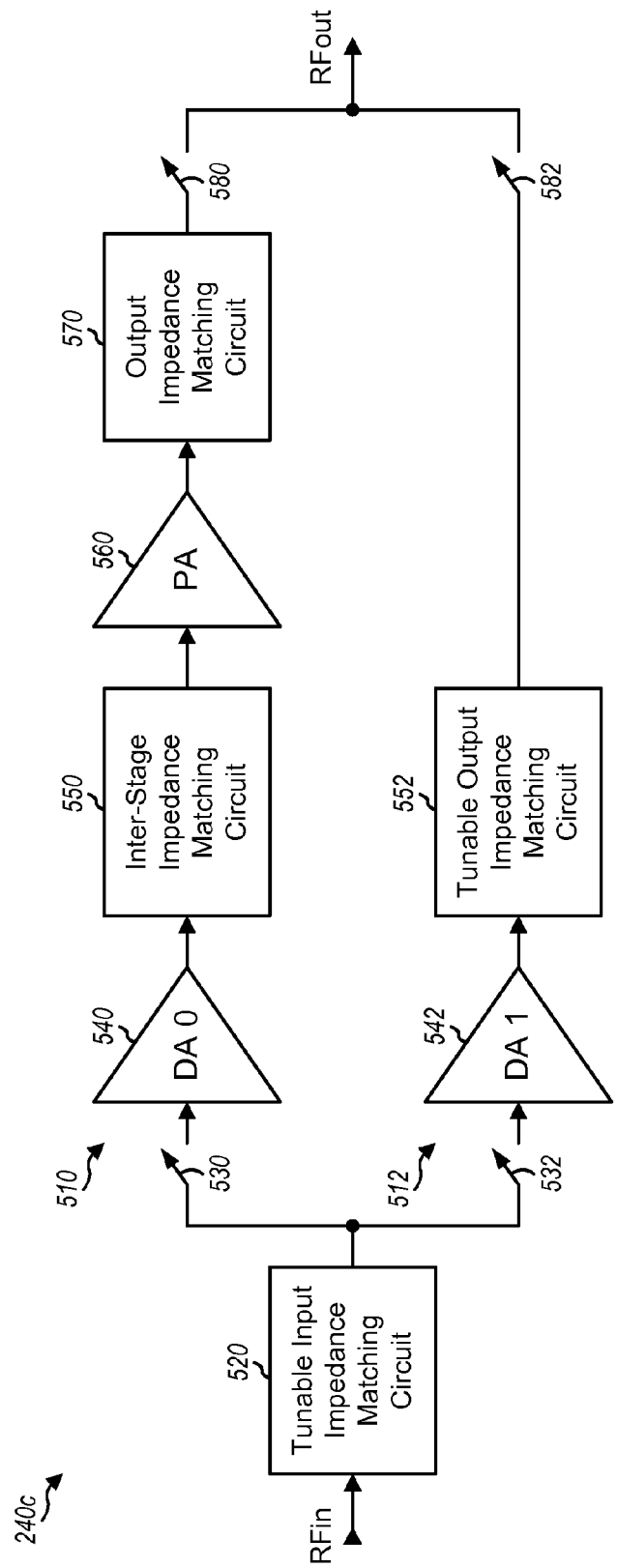
FIG. 5 shows a schematic diagram of a PA module incorporating various aspects of the present disclosure.

FIG. 5 shows a schematic diagram of a PA module 240c, which is yet another exemplary design of PA module 240 in FIG. 2. PA module 240c includes a main transmit path 510 and a multi-mode bypass transmit path 512. Main transmit path 510 includes a driver amplifier 540 and a power amplifier 560. Bypass path 512 includes only a multi-mode driver amplifier 542 and no power amplifier. In the exemplary design shown in FIG. 5, a tunable input impedance matching circuit 520 is shared by both main transmit path 510 and bypass transmit path 512. Matching circuit 520 has its input coupled to an input (RFin) of PA module 240c and its output coupled to both transmit paths 510 and 512.

Within main transmit path 510, a switch 530 has one end coupled to the output of input impedance matching circuit 520. Driver amplifier 540 has its input coupled to the other end of switch 530 and its output coupled to the input of an inter-stage impedance matching circuit 550. Power amplifier 560 has its input coupled to the output of matching circuit 550 and its output coupled to the input of an output impedance matching circuit 570. A switch 580 has one end coupled to the output of matching circuit 570 and the other end coupled to an output (RFout) of PA module 240c.

Within bypass transmit path 512, a switch 532 has one end coupled to the output of input impedance matching circuit 520. Driver amplifier 542 has its input coupled to the other end of switch 532 and its output coupled to the input of a tunable output impedance matching circuit 552. A switch 582 has one end coupled to the output of matching circuit 552 and the other end coupled to the output of PA module 240c.

In main transmit path 510, matching circuit 520 performs input impedance matching for driver amplifier 540. Driver amplifier 540 provides amplification for an input RF signal. Matching circuit 550 performs impedance matching between the output of driver amplifier 540 and the input of power amplifier 560. Power amplifier 560 provides amplification and high output power for an output RF signal. Matching circuit 570 performs output impedance matching for power amplifier 560. In bypass transmit path 512, matching circuit 520 performs input impedance matching for driver amplifier 542. Driver amplifier 542 provides amplification for the input RF signal. Matching circuit 552 performs output impedance matching for driver amplifier 542.

FIG. 5 shows an exemplary design of a PA module with a main transmit path and a multi-mode bypass transmit path having a multi-mode driver amplifier with tunable output impedance matching. A PA module with a main transmit path and a multi-mode bypass transmit path may also be implemented in other manners. For example, the main transmit path and the multi-mode bypass transmit path may include separate input impedance matching circuits, instead of a shared input impedance matching circuit as shown in FIG. 5. As another example, an output impedance matching circuit (e.g., matching circuit 570 for power amplifier 560 or matching circuit 552 for driver amplifier 542) may be combined with other circuits (e.g., a directional coupler) in a transmitter.

Figure 6:
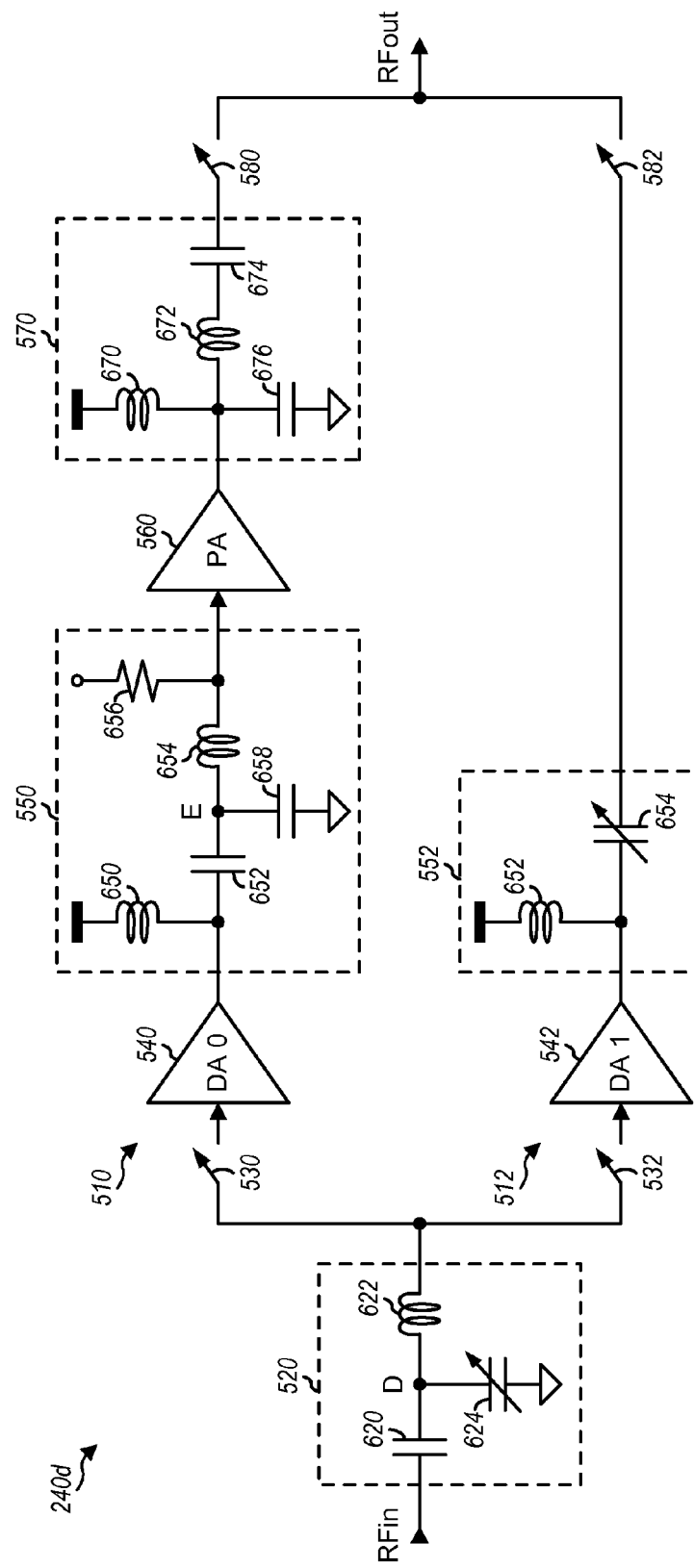
FIG. 6 shows a schematic diagram of impedance matching circuits in the PA module in FIG. 5.

FIG. 6 shows a schematic diagram of a PA module 240d, which is an exemplary design of PA module 240c in FIG. 5. FIG. 6 shows exemplary designs of tunable impedance matching circuits 520 and 552 in FIG. 5. Within tunable input impedance matching circuit 520, a capacitor 620 is coupled between the input of matching circuit 520 and node D. An inductor 622 is coupled between node D and the output of matching circuit 520. A tunable capacitor 624 is coupled between node D and circuit ground. Within tunable output impedance matching circuit 552 in bypass transmit path 512, an inductor 652 is coupled between the input of matching circuit 552 and the Vdd supply. A tunable capacitor 654 is coupled between the input and output of matching circuit 552.

In the exemplary design shown in FIG. 6, output impedance matching circuit 552 includes a tunable series capacitor 654 to achieve a desired load impedance at different transmit power levels. Input impedance matching circuit 520 includes a tunable shunt capacitor 624 to adjust input impedance matching.

FIG. 6 shows exemplary designs of tunable impedance matching circuits 520 and 552. A tunable impedance matching circuit may also be implemented based on various other designs, some of which are described below.

FIG. 7A shows an exemplary design of a tunable impedance matching circuit 710 based on an L topology. The L topology includes a series circuit component coupled to a shunt circuit component. A series circuit component is a circuit component connected between two nodes, and a shunt circuit component is a circuit component connected between a node and circuit ground. A circuit component may be an inductor, a capacitor, a resistor, etc. Matching circuit 710 includes (i) a series inductor 712 coupled between the input and output of matching circuit 710 and (ii) a tunable shunt capacitor 714 coupled between the output of matching circuit 710 and circuit ground.

FIG. 7B shows an exemplary design of a tunable impedance matching circuit 720 based on the L topology. Matching circuit 720 includes (i) a tunable series capacitor 722 coupled between the input and output of matching circuit 720 and (ii) a shunt inductor 724 coupled between the output of matching circuit 720 and circuit ground.

FIG. 7C shows an exemplary design of a tunable impedance matching circuit 730 based on an R topology. The R topology includes a shunt circuit component coupled to a series circuit component. Matching circuit 730 includes (i) a tunable shunt capacitor 732 coupled between the input of matching circuit 730 and circuit ground and (ii) a series inductor 734 coupled between the input and output of matching circuit 730.

FIG. 7D shows an exemplary design of a tunable impedance matching circuit 740 based on a Pi topology. The Pi topology includes a shunt circuit component coupled to a series circuit component, which is coupled to a shunt circuit component. Matching circuit 740 includes (i) a shunt capacitor 742 coupled between the input of matching circuit 740 and circuit ground, (ii) a series inductor 744 coupled between the input and output of matching circuit 740, and (iii) a tunable shunt capacitor 746 coupled between the output of matching circuit 740 and circuit ground.

FIG. 7E shows an exemplary design of a tunable impedance matching circuit 750 with two R sections. Matching circuit 750 includes (i) a shunt inductor 752 coupled between the input of matching circuit 750 and the Vdd supply, (ii) a series capacitor 754 coupled between the input of matching circuit 750 and node E, (iii) a tunable shunt capacitor 756 coupled between node E and circuit ground, and (iv) a series inductor 758 coupled between node E and the output of matching circuit 750.

FIG. 7F shows an exemplary design of a tunable impedance matching circuit 760 based on the Pi topology. Matching circuit 760 includes (i) a shunt inductor 762 coupled between the input of matching circuit 760 and the Vdd supply, (ii) a series capacitor 764 coupled between the input and output of matching circuit 760, (iii) a tunable shunt capacitor 766 coupled between the output of matching circuit 760 and circuit ground, and (iv) a shunt inductor 768 coupled between the output of matching circuit 760 and circuit ground.

Some exemplary designs of tunable impedance matching circuits have been described above in FIGS. 6 to 7F. In general, a tunable impedance matching circuit may include any number of stages of matching circuits. More stages may be used to increase bandwidth, provide more flexibility in impedance matching, reduce loss by reducing an impedance transform ratio of each stage, and/or provide other benefits at the expense of more circuit components. Each stage may be implemented based on the L topology, the R topology, the Pi topology, a T topology, etc. The T topology includes a series circuit component coupled to a shunt circuit component and also to another series circuit component, e.g., as shown for matching circuit 520 in FIG. 6. Different circuit topologies may be more suitable for different nominal input or output impedances of amplifiers. For example, some circuit topologies may be more suitable when an input or an output impedance appears inductive whereas other circuit topologies may be more suitable when the input or output impedance appears capacitive.

In general, any suitable tunable impedance matching circuit may be used for a multi-mode driver amplifier. The tuning enables the single multi-mode driver amplifier to meet linearity requirements and achieve good efficiency over a wide range of transmit power levels. The multi-mode driver amplifier may also have tunable input impedance to improve performance.

In general, a tunable impedance matching circuit may include any number of tunable circuit components. A tunable circuit component may be a tunable series capacitor (e.g., capacitor 654 in matching circuit 552 in FIG. 6), a tunable shunt capacitor (e.g., capacitor 624 in matching circuit 520 in FIG. 6), a tunable series inductor, a tunable shunt inductor, etc. It may be easier to implement a tunable capacitor than a tunable inductor. A tunable capacitor may be implemented with a variable capacitor (varactor) having a capacitance that can be adjusted based on an analog control voltage. A tunable capacitor may also be implemented with a set of capacitors that can be individually selected or unselected to change capacitance. In any case, a tunable capacitor in a tunable impedance matching circuit may be varied to improve impedance matching and obtain good performance.

FIG. 8 shows a schematic diagram of an exemplary design of a tunable capacitor 810 implemented with switchable capacitors. In the exemplary design shown in FIG. 8, tunable capacitor 810 is implemented with a fixed capacitor 820 and a set of N switchable capacitors 830a to 830n, where N may be any integer value. Capacitor 820 is coupled between a first terminal 812 and a second terminal 814 of tunable capacitor 810. Each switchable capacitor 830 is coupled in series with an associated switch 832. Each switchable capacitor 830 has one end coupled to first terminal 812 of tunable capacitor 810 and the other end coupled to one end of the associated switch 832. The other end of switch 832 is coupled to second terminal 814 of tunable capacitor 810. Switches 832a to 832n receive N control signals, which are not shown in FIG. 8 for simplicity. Each switch 832 may be opened or closed based on its associated control signal.

In one exemplary design, the N switchable capacitors 830a to 830n may have the same capacitance value. In another exemplary design, the N switchable capacitors 830a to 830n may have different capacitance values, e.g., C, 2C, 4C, etc., where C is a base unit of capacitance.

A tunable circuit component may be designed to have a suitable tuning range, i.e., a suitable range of values for the circuit component. In an exemplary design, a tunable capacitor may be designed to have a tuning range of approximately C to 4C, where 2C is a nominal capacitance value of the tunable capacitor. This 4:1 tuning range may be much larger than a typical tuning range of a tunable capacitor in an impedance matching circuit. The larger tuning range may result in more insertion loss, which is generally undesirable. The larger insertion loss may be unacceptable in a full-power mode but may be acceptable in a bypass mode. In other exemplary designs, a tunable capacitor may be designed to have a tuning range greater than 4:1 or less than 4:1.

A tunable impedance matching circuit may be controlled in various manners. In one exemplary design, the tunable impedance matching circuit may be adjusted based on pre-characterization of the matching circuit. For example, the performance of wireless device 110 may be characterized (e.g., during the circuit design phase or the manufacturing phase) for different possible settings of one or more tunable capacitors in the tunable impedance matching circuit at a given transmit power level. The setting that can provide the best performance at the given transmit power level may be stored in a look-up table (e.g., in memory 212 in FIG. 2). The characterization may be performed for different transmit power levels of interest, and the setting that can provide the best performance at each transmit power level may be stored in the look-up table. The characterization may be performed by computer simulation, lab measurements, factory measurements, field measurements, etc. Thereafter, the setting that can provide the best performance at a transmit power level of interest may be retrieved from the look-up table and applied to the tunable impedance matching circuit.

In another exemplary design, the tunable impedance matching circuit may be dynamically adjusted, e.g., during operation. For example, one or more parameters such as delivered power, measured impedance, return loss, insertion loss, reflection coefficient, voltage standing wave ratio (VSWR), mismatch loss, etc. may be measured for different possible settings of a tunable capacitor. The setting that can provide the best performance, as measured by the one or more parameters, may be selected for use.

In yet another exemplary design, the tunable impedance matching circuit may be adjusted based on a combination of pre-characterization of the matching circuit and dynamic adjustment. For example, the performance of the tunable impedance matching circuit may be pre-characterized, and the setting that can provide good performance at a transmit power level of interest may be retrieved from the look-up table and applied to the tunable impedance matching circuit. The tunable impedance matching circuit may then be dynamically adjusted (e.g., within a more narrow range around a nominal value corresponding to the selected setting) during operation.

The tunable impedance matching circuit may also be adjusted in other manners. In any case, the tunable impedance matching circuit may include a plurality of settings for different transmit power levels. Each setting may correspond to a different set of values for all tunable circuit components in the matching circuit (e.g., a different capacitance value for capacitor 652 in FIG. 6). For example, capacitor 652 may be set to a first value (C1) for a low transmit power level, to a second value (C2) for a medium transmit power level, or to a third value (C3) for a high transmit power level. The tunable impedance matching circuit may enable a multi-mode driver amplifier to achieve good performance (e.g., in terms of linearity and efficiency) over a wide range of transmit power levels.

Figure 9A:
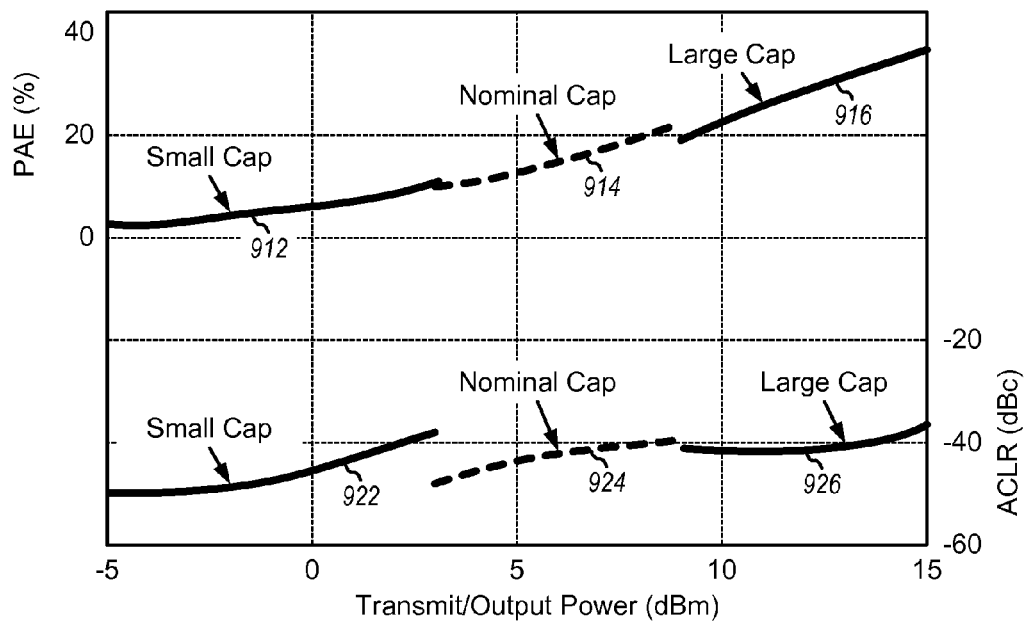
FIGS. 9A and 9B show linearity and DC bias current of a multi-mode driver amplifier for different capacitance values of an output impedance matching circuit.

FIG. 9A shows PAE and linearity of multi-mode driver amplifier 542 in FIGS. 5 and 6 versus transmit/output power level. In FIG. 9A, the horizontal axis represents transmit power and is given in units of dBm. The left vertical axis represents PAE and is given in units of percent (%). The right vertical axis represents adjacent channel leakage ratio (ACLR) and is given in units of decibel below carrier (dBc). ACLR is a metric for linearity, with a lower (i.e., more negative) ACLR corresponding to better linearity. In the exemplary design shown in FIG. 9A, a small capacitance value (e.g., C) is selected for capacitor 654 for low transmit power levels less than 3 dBm, a nominal capacitance value (e.g., 2C) is selected for capacitor 654 for medium transmit power levels between 3 and 9 dBm, and a large capacitance value (e.g., 4C) is selected for capacitor 654 for high transmit power levels above 9 dBm.

In FIG. 9A, a plot 912 shows PAE versus transmit power for the case of a small capacitance value of C for capacitor 654 in output impedance matching circuit 552 in FIG. 6. A plot 914 shows PAE versus transmit power for the case of a nominal capacitance value of 2C for capacitor 654. A plot 916 shows PAE versus transmit power for the case of a large capacitance value of 4C for capacitor 654.

In FIG. 9A, a plot 922 shows ACLR versus transmit power for the case of a small capacitance value of C for capacitor 654 in output impedance matching circuit 552 in FIG. 6. A plot 924 shows ACLR versus transmit power for the case of a nominal capacitance value of 2C for capacitor 654. A plot 926 shows ACLR versus transmit power for the case of a large capacitance value of 4C for capacitor 654.

Figure 9B:
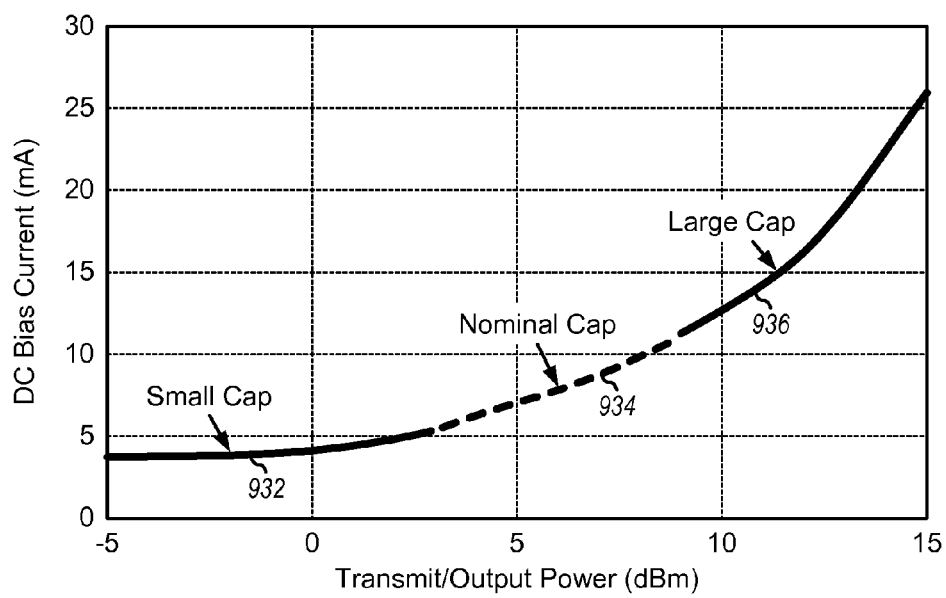

FIG. 9B shows direct current (DC) bias current of multi-mode driver amplifier 542 versus transmit/output power level. In FIG. 9B, the horizontal axis represents transmit power and is given in units of dBm. The vertical axis represents DC bias current and is given in units of milli-Amperes (mA). In FIG. 9B, a plot 932 shows DC bias current versus transmit power for the case of a small capacitance value of C for capacitor 654. A plot 934 shows DC bias current versus transmit power level for the case of a nominal capacitance value of 2C for capacitor 654. A plot 936 shows DC bias current versus transmit power level for the case of a large capacitance value of 4C for capacitor 654.

As shown in FIGS. 9A and 9B, good linearity and lower ACLR may be achieved at higher transmit power (e.g., from 9 to 16 dBm) with a larger capacitance value for capacitor 654. However, the larger capacitance value for capacitor 654 would result in more DC bias current being consumed. Hence, a larger capacitance value may be selected for capacitor 654 at higher transmit power to obtain the desired linearity, and a smaller capacitance value may be selected for capacitor 654 at lower transmit power in order to reduce power consumption. For example, a low capacitance value of C may be selected for capacitor 654 at a transmit power level of 3.5 dBm to meet an ACLR requirement of −5 dBc and achieve a low DC bias current of approximately 5.4 mA. As shown in FIGS. 9A and 9B, low DC bias current of approximately 5 mA may be used at a low transmit power level approximately 3 dBm. Higher DC bias current may be used to achieve good PAE of approximately 37% and good ACLR of approximately −38 dBc at a high transmit power level of 15 dBm. Good overall performance may thus be achieved across a wide range of the transmit power levels. In contrast, if a fixed capacitor of a small value (instead of an adjustable capacitor) is used for capacitor 654, then ACLR may be poor at transmit power levels higher than 3 dBm and may fail specifications. If a fixed capacitor of a large value is used for capacitor 654, then DC bias current would be high and PAE would be low at low transmit power levels, e.g., of less than 3 dBm.

A driver amplifier and a power amplifier may be implemented in various manners, e.g., with various types of transistors and based on various circuit designs. An exemplary design of an amplifier is described below.

Figure 10:
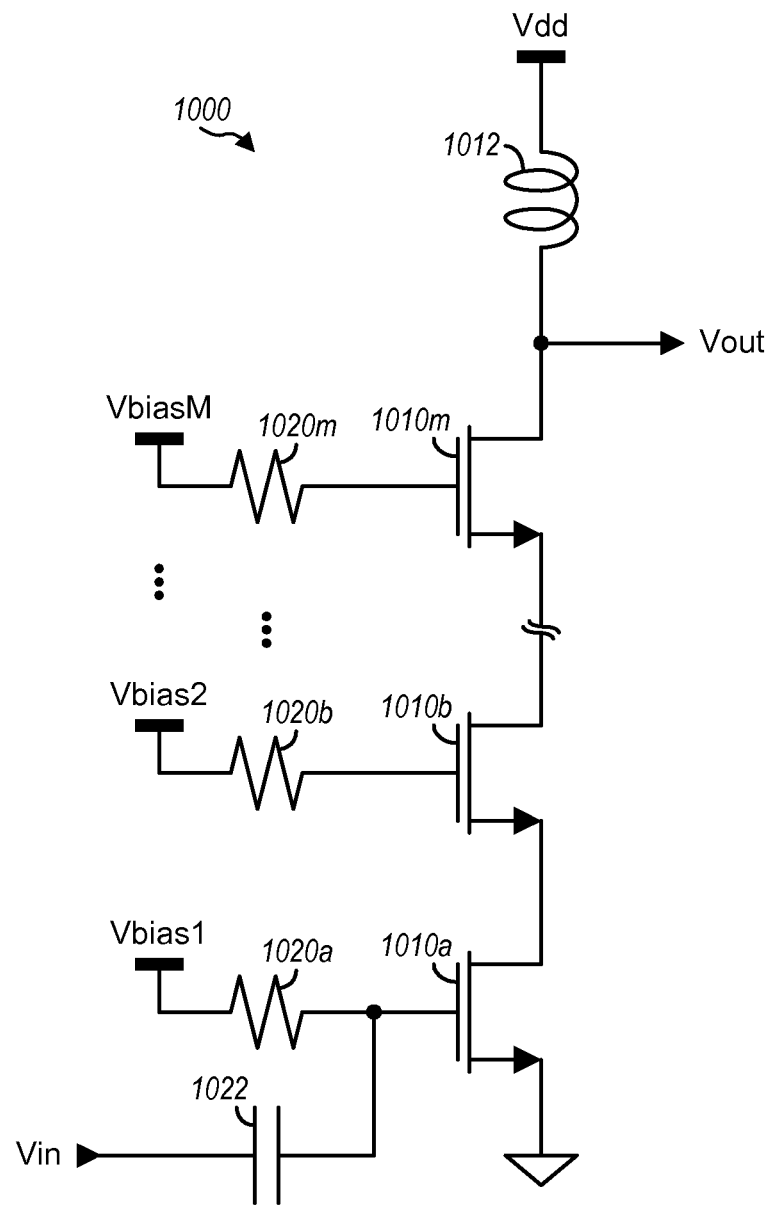
FIG. 10 shows a schematic diagram of an amplifier.

FIG. 10 shows a schematic diagram of an exemplary design of an amplifier 1000, which may be a power amplifier or a driver amplifier. Amplifier 1000 includes M N-channel metal oxide semiconductor (NMOS) transistors 1010a through 1010m coupled in a stack, where M may be any integer value. The bottommost NMOS transistor 1010a has its source coupled to circuit ground and its gate receiving an input signal (Vin) via an alternating current (AC) coupling capacitor 1022. Each higher up NMOS transistor 1010 in the stack has its source coupled to the drain of another NMOS transistor below in the stack. The topmost NMOS transistor 1010m has its drain providing an output signal (Vout). A load inductor 1012 is coupled between the Vdd supply and the drain of the topmost NMOS transistor 1010m and provides DC bias current for amplifier 1000. Load inductor 1012 may be part of an output or an inter-stage impedance matching circuit. For example, load inductor 1012 may correspond to shunt inductor 652 in output impedance matching circuit 552 in FIG. 6. The gates of NMOS transistors 1010a to 1010m receive M bias voltages, Vbias1 through VbiasM, via M resistors 1020a through 1020m, respectively. The bias voltages may be generated to turn on amplifier 1000 when it is enabled and to turn off amplifier 1000 when it is disabled.

The Vout signal may have a large voltage swing, especially if amplifier 1000 is used as a power amplifier. The large voltage swing may exceed a breakdown voltage of each NMOS transistor 1010. The large voltage swing of the Vout signal may be split or distributed approximately equally across the M NMOS transistors 1010$a$ to 1010$m$. Each NMOS transistor 1010 may then observe only a fraction of the voltage swing, which may be less than the breakdown voltage of each NMOS transistor in order to achieve high reliability. The M bias voltages Vbias1 through VbiasM may be selected to provide the desired voltage splitting of the Vout signal, e.g., so that each NMOS transistor 1010 observes approximately 1/M-th of the voltage swing.

FIG. 10 shows an exemplary design of an amplifier, which may also be implemented in other manners. For example, an amplifier may be implemented with transistors of other types, or other circuit designs, etc. The exemplary design shown in FIG. 10 may be used for any of the driver amplifiers and any of the power amplifiers in FIGS. 3 to 6. The number of stacked transistors, the transistor size, the load inductor, the bias current, the bias voltages, and/or other circuit characteristics may be different for a driver amplifier and a power amplifier.

Amplifier 1000 may be used for multi-mode driver amplifier 542 in FIGS. 5 and 6. In this case, amplifier 1000 may include a plurality of settings for different transmit power levels. Each setting of amplifier 1000 may be associated with a particular set of bias voltages for NMOS transistors 1010$a$ to 1010$m$ and/or a particular DC bias current for amplifier 1000. For example, the Vbias1 to VbiasM voltages may be (i) set higher for higher transmit power levels to obtain the desired drive and linearity or (ii) set lower for lower transmit power levels to reduce power consumption. In an exemplary design, the performance of amplifier 1000 may be characterized for different possible settings for each transmit power level of interest. The best setting for each transmit power level may be stored in a look-up table. During operation, a setting may be retrieved from the look-up table for the present transmit power level and applied to amplifier 1000. Amplifier 1000 may also be set or adjusted in other manners.

In an exemplary design, an apparatus (e.g., a wireless device, an IC, a circuit module, etc.) may comprise a driver amplifier and a tunable impedance matching circuit, e.g., as shown in FIGS. 5 and 6. The driver amplifier (e.g., driver amplifier 542 in FIGS. 5 and 6) may amplify an input RF signal and provide an amplified RF signal. The tunable impedance matching circuit (e.g., matching circuit 552 in FIGS. 5 and 6) may be coupled to the driver amplifier and may match an output impedance of the driver amplifier.

In an exemplary design, the driver amplifier may include a plurality of settings for a plurality of modes. The plurality of modes may be associated with at least one of a plurality of transmit power levels, a plurality of frequency bands, or a plurality of radio technologies. The plurality of settings of the driver amplifier may be associated with different bias voltages and/or different bias currents for the driver amplifier. In an exemplary design, a look-up table may store the plurality of settings of the driver amplifier. The look-up table may receive a selected mode (e.g., a selected transmit power level) and may provide one of the plurality of settings corresponding to the selected mode.

In an exemplary design, the tunable impedance matching circuit may include a plurality of settings for the plurality of modes (e.g., the plurality of transmit power levels). In an exemplary design, the tunable impedance matching circuit may comprise a tunable capacitor having an adjustable capacitance value. The plurality of settings of the tunable impedance matching circuit may be associated with different capacitance values for the tunable capacitor. The tunable capacitor may have a tuning range of at least two to one (e.g., a tuning range of approximately four to one). The tunable capacitor may have a plurality of capacitance values associated with the plurality of modes. In an exemplary design, the tunable capacitor may comprise at least one capacitor coupled to at least one switch, e.g., as shown in FIG. 8. Each of the at least one capacitor may be selected or unselected based on an associated switch. In another exemplary design, the tunable capacitor may be implemented with a varactor or some other type of tunable capacitor.

In an exemplary design, the tunable impedance matching circuit (e.g., matching circuit 552) may comprise a tunable capacitor and an inductor, e.g., as shown in FIG. 6. The tunable capacitor (e.g., capacitor 654) may be coupled between an input and an output of the tunable impedance matching circuit. The inductor (e.g., inductor 652) may be coupled between the input of the tunable impedance matching circuit and a power supply (as shown in FIG. 6) or circuit ground. The tunable impedance matching circuit may also be implemented in other manners, e.g., based on any of the circuit designs in FIGS. 7A to 7F.

The apparatus may further comprise a second tunable impedance matching circuit (e.g., matching circuit 520 in FIGS. 5 and 6) coupled to the driver amplifier and configured to perform input impedance matching for the driver amplifier. In an exemplary design, the second tunable impedance matching circuit may comprise a first capacitor, an inductor, and a tunable capacitor. The first capacitor (e.g., capacitor 620 in FIG. 6) may be coupled between an input of the second tunable impedance matching circuit and an intermediate node. The inductor may be coupled between the intermediate node and an output of the second tunable impedance matching circuit. The tunable capacitor may be coupled between the intermediate node and circuit ground. The second tunable impedance matching circuit may also be implemented in other manners, e.g., based on any of the circuit designs in FIGS. 7A to 7F.

In an exemplary design, the apparatus may comprise a main transmit path and a bypass transmit path. The bypass transmit path (e.g., bypass transmit path 512 in FIGS. 5 and 6) may comprise the driver amplifier, the tunable impedance matching circuit, and no power amplifier. The main transmit path (e.g., main transmit path 510 in FIGS. 5 and 6) may comprise a second driver amplifier and a power amplifier. In an exemplary design, the main transmit path may be selected for transmit power levels higher than a threshold level, and the bypass transmit path may be selected for transmit power levels lower than the threshold level. The main transmit path and the bypass transmit path may also be selected based on different threshold levels in order to provide hysteresis and mitigate continual toggling between the two transmit paths.

In an exemplary design, the second tunable impedance matching circuit may be coupled to (and shared by) the main transmit path and the bypass transmit path and may match an input impedance of the driver amplifier or the second driver amplifier. In another exemplary design, separate tunable input impedance matching circuits may be coupled to the main transmit path and the bypass transmit path. Each tunable input impedance matching circuit may match an input impedance of the driver amplifier in its transmit path.

Figure 11:
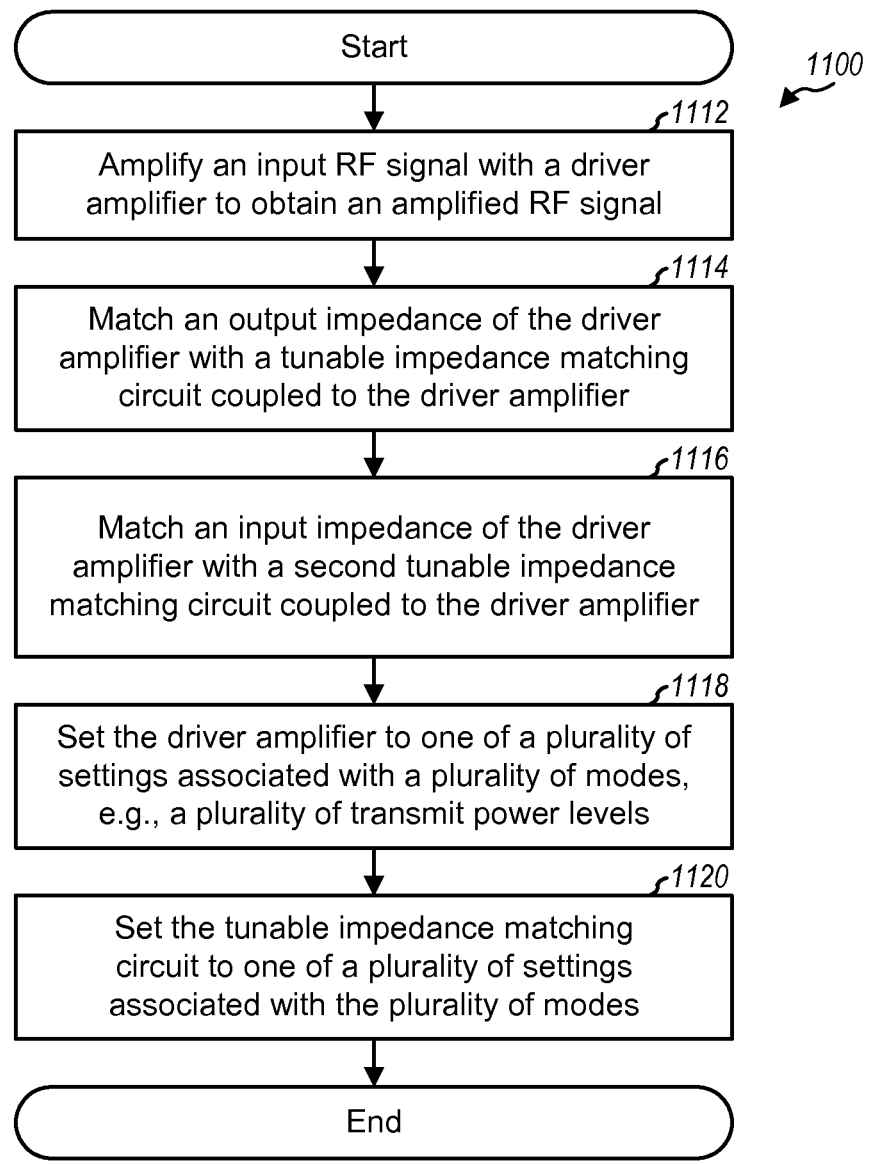
FIG. 11 shows a process for amplifying a signal.

FIG. 11 shows an exemplary design of a process 1100 performed by a wireless device. An input RF signal may be amplified with a driver amplifier to obtain an amplified RF signal (block 1112). An output impedance of the driver amplifier may be matched with a tunable impedance matching circuit coupled to the driver amplifier (block 1114). An input impedance of the driver amplifier may be matched with a second tunable impedance matching circuit coupled the driver amplifier (block 1116). The driver amplifier may be set to one of a plurality of settings associated with a plurality of modes, e.g., a plurality of transmit power levels (block 1118). The plurality of settings of the driver amplifier may be associated with different bias voltages and/or different bias currents. The tunable impedance matching circuit may also be set to one of a plurality of settings associated with the plurality of modes (block 1120). The plurality of settings of the tunable impedance matching circuit may be associated with different capacitance values, etc.

A multi-mode driver amplifier with tunable output impedance matching described herein may be implemented on an IC, an analog IC, an RFIC, a mixed-signal IC, an ASIC, a printed circuit board (PCB), an electronic device, etc. The multi-mode driver amplifier may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing a multi-mode driver amplifier with tunable output impedance matching described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    a driver amplifier in a multi-mode bypass transmit path configured to amplify an input radio frequency (RF) signal and provide an amplified RF signal, the multi-mode bypass transmit path exclusive of a power amplifier; and
    a tunable impedance matching circuit coupled to the driver amplifier and configured to match an output impedance of the driver amplifier for each of a plurality of modes of the driver amplifier.

2. The apparatus of claim 1, wherein the driver amplifier includes a plurality of settings for the plurality of modes.

3. The apparatus of claim 2, wherein the plurality of modes are associated with at least one of a plurality of transmit power levels, a plurality of frequency bands, or a plurality of radio technologies.

4. The apparatus of claim 2, wherein the plurality of settings of the driver amplifier are associated with at least one of different bias voltages or different bias currents for the driver amplifier.

5. The apparatus of claim 2, further comprising:
    a look-up table configured to store the plurality of settings of the driver amplifier, to receive a selected mode, and to provide one of the plurality of settings corresponding to the selected mode.

6. The apparatus of claim 1, wherein the tunable impedance matching circuit includes a plurality of settings for the plurality of modes.

7. The apparatus of claim 1, the tunable impedance matching circuit comprising a tunable capacitor having an adjustable capacitance value.

8. The apparatus of claim 7, the tunable capacitor comprising at least one capacitor coupled to at least one switch, each of the at least one capacitor being selected or unselected based on an associated switch.

9. The apparatus of claim 1, the tunable impedance matching circuit comprising:
    a tunable capacitor coupled between an input and an output of the tunable impedance matching circuit; and
    an inductor coupled between the input of the tunable impedance matching circuit and a power supply or circuit ground.

10. The apparatus of claim 1, further comprising:
    a second tunable impedance matching circuit coupled to the driver amplifier and configured to perform input impedance matching for the driver amplifier.

11. The apparatus of claim 10, the second tunable impedance matching circuit comprising:
    a first capacitor coupled between an input of the second tunable impedance matching circuit and an intermediate node;
    an inductor coupled between the intermediate node and an output of the second tunable impedance matching circuit; and
    a tunable capacitor coupled between the intermediate node and circuit ground.

12. The apparatus of claim 1, further comprising:
a main transmit path comprising a second driver amplifier and a power amplifier.

13. The apparatus of claim 12, wherein the main transmit path is selected for transmit power levels higher than a threshold level, and wherein the multi-mode bypass transmit path is selected for transmit power levels lower than the threshold level.

14. The apparatus of claim 12, further comprising:
a second tunable impedance matching circuit coupled to the main transmit path and the multi-mode bypass transmit path and configured to perform input impedance matching for the driver amplifier or the second driver amplifier.

15. A method comprising:
amplifying an input radio frequency (RF) signal with a driver amplifier in a multi-mode bypass transmit path to obtain an amplified RF signal, the multi-mode bypass transmit path exclusive of a power amplifier; and
matching an output impedance of the driver amplifier with a tunable impedance matching circuit coupled to the driver amplifier for each of a plurality of modes of the driver amplifier.

16. The method of claim 15, further comprising:
matching an input impedance of the driver amplifier with a second tunable impedance matching circuit coupled to the driver amplifier.

17. The method of claim 15, further comprising:
setting the driver amplifier to one of a plurality of settings associated with the plurality of modes.

18. The method of claim 15, further comprising:
setting the tunable impedance matching circuit to one of a plurality of settings associated with the plurality of modes.

19. An apparatus comprising:
means for amplifying an input radio frequency (RF) signal in a multi-mode bypass transmit path to obtain an amplified RF signal, the multi-mode bypass transmit path exclusive of a power amplifying means; and
means for matching an output impedance of the means for amplifying, the means for matching the output impedance coupled to the means for amplifying for each of a plurality of modes of the means for amplifying.

20. The apparatus of claim 19, further comprising:
means for matching an input impedance of the means for amplifying, the means for performing input impedance matching being tunable.

* * * * *